United States Patent [19]

Wong

[11] Patent Number: 5,418,673
[45] Date of Patent: May 23, 1995

[54] CONTROL ELECTRODE DISABLE CIRCUIT FOR POWER TRANSISTOR

[75] Inventor: Stephen L. Wong, Scarsdale, N.Y.

[73] Assignee: North American Philips Corporation, New York, N.Y.

[21] Appl. No.: 989,628

[22] Filed: Dec. 14, 1992

[51] Int. Cl.⁶ .............................................. H02H 7/00
[52] U.S. Cl. ........................... 361/18; 363/42; 363/50
[58] Field of Search ............... 361/18, 42; 363/50, 363/51

[56] References Cited

U.S. PATENT DOCUMENTS

| | | | |
|---|---|---|---|
| 4,492,883 | 1/1985 | Janutka | 307/571 |
| 4,720,641 | 1/1988 | Faini | 307/18 |
| 4,727,469 | 2/1988 | Cini et al. | 363/24 |
| 4,890,020 | 12/1989 | Bird | 307/571 |
| 5,200,879 | 4/1993 | Sasagawa et al. | 361/18 |

FOREIGN PATENT DOCUMENTS

| | | |
|---|---|---|
| 0239862 | 10/1987 | European Pat. Off. |
| 0337857 | 10/1989 | European Pat. Off. |
| 0352828 | 1/1990 | European Pat. Off. |
| 116118 | 1/1989 | Japan |
| 122107 | 1/1989 | Japan |

OTHER PUBLICATIONS

"Design of a 60V 10-A Intelligent Power Switch Using Standard Cells" Wong et al; IEEE Journal of Solid-State Circuits, vol. 27, No. 3, Mar. 1992.

Primary Examiner—Todd E. DeBoer
Attorney, Agent, or Firm—Steven R. Biren

[57] ABSTRACT

Power transistors used as high-side power switches are typically subjected to a variety of potentially destructive conditions, such as loss of bias current or loss of a ground connection in associated control circuitry. In order to protect the power transistor upon occurrence of such a potentially destructive condition, a control electrode disable circuit is provided to ensure that the power transistor will be turned off upon the occurrence of such a condition, or when the control circuits are deliberately turned off or placed in a standby mode. Turn-off of the power transistor is ensured by shunting a disable transistor across the input of the power transistor, and providing a disable circuit for activating the disable transistor in the event of loss of bias or loss of ground in the control circuitry. Reliable activation of the disable transistor is ensured by a bootstrap capacitor circuit in the disable circuit.

4 Claims, 1 Drawing Sheet

CONTROL ELECTRODE DISABLE CIRCUIT FOR POWER TRANSISTOR

BACKGROUND OF THE INVENTION

This invention relates to the protection of power transistors in both discrete and power integrated circuit (PIC) or intelligent power switch (IPS) applications. More particularly, the invention relates to protecting such power transistors from damage due to loss of bias current or loss of a ground connection in control circuitry associated with the power transistor.

PIC or IPS devices are presently utilized in a wide variety of industrial applications, including automotive, lighting and motor control circuits. In many of these applications, the power transistor which supplies the load must handle substantial currents and/or voltages. Under such conditions, various circuit malfunctions, such as the loss of bias current or loss of a ground connection in associated control circuitry, may cause the power transistor to be damaged or even destroyed. Accordingly, continuing efforts have been directed towards devising simple and reliable techniques for protecting both discrete and integrated power transistors against these malfunctions.

An intelligent power switch for use in automotive applications and having a 60 volt and 10 ampere drive capability is described in "Design of a 60-V 10-A Intelligent Power Switch Using Standard Cells", IEEE Journal of Solid-State Circuits, Vol. 27, No. 3, pp. 429–432, March, 1992, by S. L. Wong et al. In FIG. 3 of that paper, there is shown an MOS power transistor configured as a high-side power switch, with gate control circuitry (including a charge pump) coupled to the gate of the transistor, and a second MOS transistor connected between the gate and source of the power transistor to short out its gate-to-source voltage to shut off and thereby protect the power transistor in case of malfunction, although no specific circuitry for this purpose is disclosed. The purpose of the charge pump in the gate control circuit is to provide a gate voltage to the MOS power transistor which is higher than the power supply voltage, thus ensuring that the output at the source of this transistor will be as close as possible to the power supply voltage. However, this creates a potential problem in activating the protection transistor in the event of a circuit failure when the power transistor is activated.

An example of a specific gate disable circuit for use with a high-side power transistor is shown in European Patent No. 0239862. In the circuit disclosed in that reference, the transistor (T2) used for shorting out the gate-to-source voltage of power transistor (T1) is a depletion-mode transistor with its gate G connected directly to ground at terminal 5. As long as the ground connection is maintained, depletion-mode transistor T2 will be in the "off" state, thus permitting normal operation of power transistor T1. If the ground connection at terminal 5 is lost, however, transistor T2, being a depletion-mode transistor will turn "on", thus providing a gate-to-source short across T1 and thereby protecting this transistor from damage that might otherwise occur due to the loss of the ground connection. However, since the gate of transistor 2 is permanently connected to ground during normal operation, this transistor cannot be activated to provide protection for the power transistor in the event of a failure mode other than loss of ground, and this transistor also cannot serve as a standby-mode disable for the power transistor. Furthermore, the provision of a depletion-mode transistor in addition to enhancement-mode transistors in the same integrated circuit results in additional complication and expense in the fabrication process.

Accordingly, it would be desirable to have a disable circuit for the control electrode of a power transistor which avoids the use of a depletion-mode transistor and is thus simpler and more economical to manufacture. Additionally, the circuit should be responsive to more than one failure mode, and should be capable of turning off the power transistor even if both of the main terminals of that transistor are very close to the power supply voltage.

SUMMARY OF THE INVENTION

It is thus an object of the invention to provide a disable circuit for a power transistor which does not require the use of a depletion mode transistor in addition to the enhancement mode transistors conventionally used in such circuits, and which can accordingly be simply and economically fabricated.

It is a further object of the invention to provide a disable circuit which can detect and activate in response to more than one potentially-harmful operating condition, and which can effectively disable the power transistor even if both of its main electrodes are at a potential very close to the high power supply voltage.

In accordance with the invention, these objects are achieved by a new disable circuit for the control electrode of a high-side power transistor which includes a disable transistor having its main electrodes connected across the control input of the power transistor and its control electrode connected to a circuit which is responsive to a disable signal or an open ground circuit. Additionally, the circuit which activates the disable transistor includes a capacitor coupled to the control electrode of the disable transistor in order to generate a voltage at the control electrode which is at least temporarily higher than the power supply voltage, to ensure that the disable circuit can function effectively even if the voltage on both main electrodes of the power transistor is very close to the full power supply voltage.

The capacitor in the disable circuit is configured as a so-called "bootstrap" capacitor, and additional control transistors are provided to permit the circuit to respond to a disable signal or an open circuit in the ground connection to the disable or control circuit.

BRIEF DESCRIPTION OF THE DRAWING

The invention may be more completely understood with reference to the following detailed description, to be read in conjunction with the accompanying drawing, in which.

DESCRIPTION OF THE PREFERRED EMBODIMENTS

Figure 1:
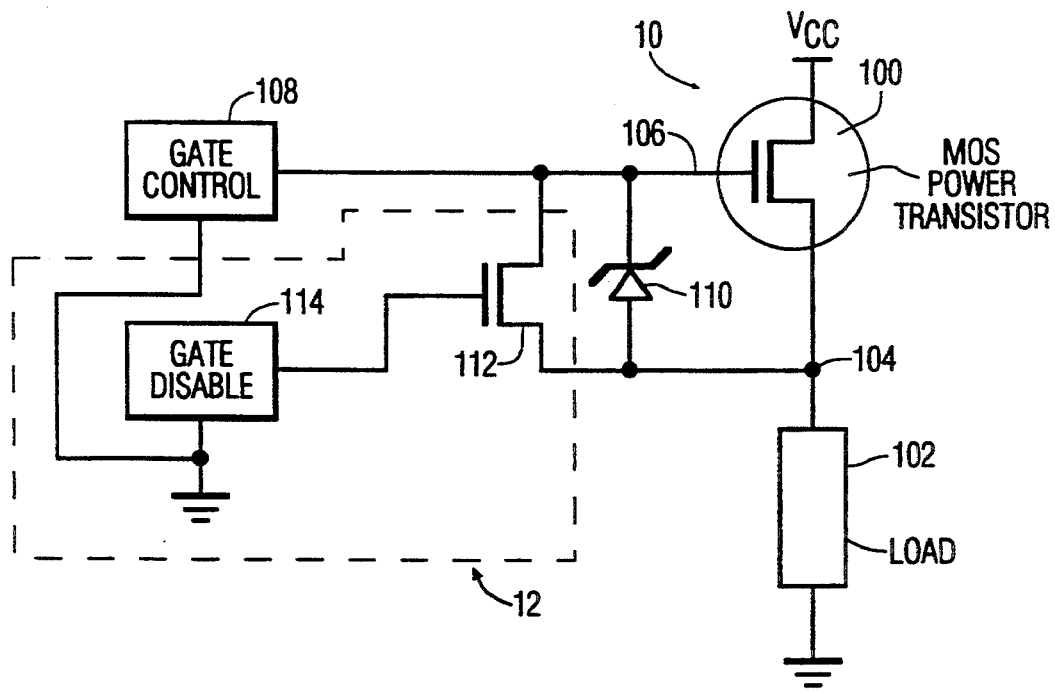
FIG. 1 shows a partially-schematic and partially-block diagram of a prior-art disable circuit for a power transistor.

A gate disable circuit for a high-side MOS power transistor, of the general type disclosed in the previously-cited IEEE Journal Paper co-author by the present inventor, is shown in partially-schematic and partially-block diagram form in FIG. 1. An output section 10 of a PIC or IPS device includes a power MOS transistor 100 have its drain connected to a power line Vcc and its source connected to one end of a load 102, which may typically be a lamp, a motor, or other power-consuming device, at a first terminal 104. The second terminal of load 102 is connected to ground. A gate electrode 106 of the MOS power transistor is shown connected to a gate control circuit 108, represented in FIG. 1 in block-diagram form. This gate control circuitry includes the circuitry for controlling the state of transistor 100, as well as the charge-pump bias circuit for generating a gate bias voltage above the level of power supply voltage Vcc, in order to ensure maximum output voltage at the source of the power transistor. In this embodiment, a zener diode 110, which is optional, is shown connected between the gate and source of power transistor 100 to protect the gate electrode against an over-voltage condition.

A gate electrode disable circuit 12 includes a disable transistor 112 having its two main electrodes connected between the gate and source of power transistor 100, and its gate electrode connected to a gate disable circuit 114. It should be noted that in the configuration shown in FIG. 1, whether the MOS power transistor 100 is integrated into a PIC or is a discrete component power device, the power transistor and load will be provided with a separate ground connection from that provided for the gate electrode circuit 108 and gate disable circuit 114, as symbolically shown in FIG. 1.

Figure 2:
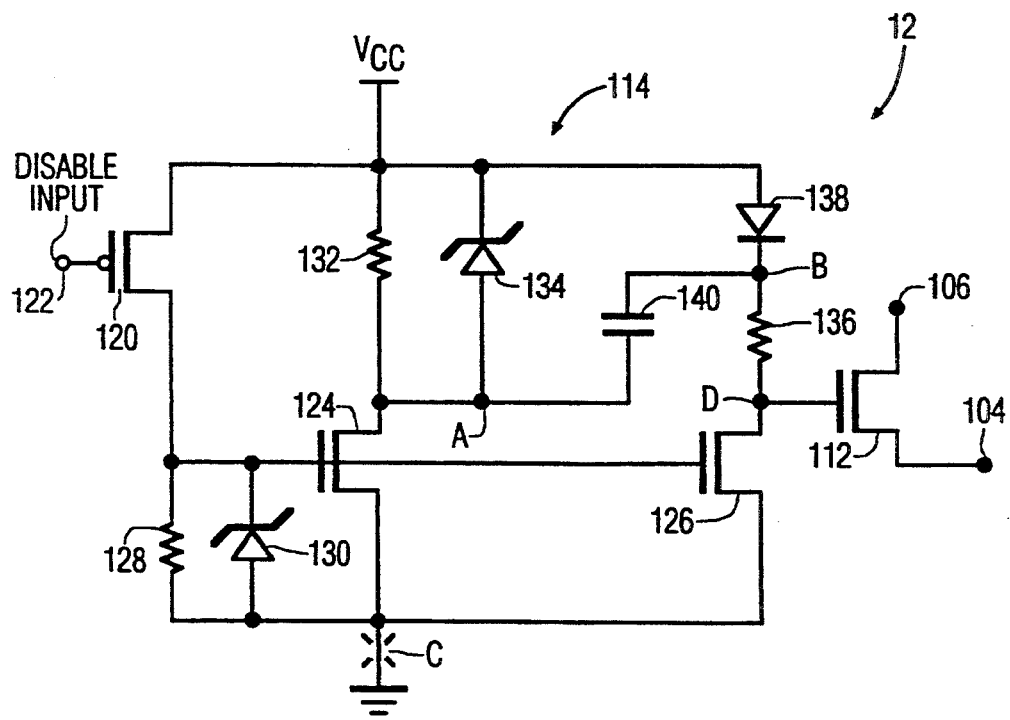
FIG. 2 shows a schematic diagram of a disable circuit in accordance with the invention.

In FIG. 2, the portion of the circuit of FIG. 1 inside the dashed-line block 12 is shown in further detail. The circuit of FIG. 2 includes disable transistor 112, and a new disable circuit 114 in accordance with the present invention. The circuit 114 includes a transistor 120 having a disable input 122 and having an output coupled to the inputs of two further transistors 124 and 126. The circuit further includes a resistor 128 and, optionally, a zener protection diode 130 coupled between the gate electrode of transistor 124 and ground. A resistor 132 is used to couple the output of transistor of 124 to power supply line Vcc in the "off" state, and a zener diode 134 may be placed in parallel with the resistor 132 to regulate the output voltage of transistor 124 in the "on" state, as will described in further detail hereinafter. Transistor 126 has its gate electrode connected in parallel with the gate electrode of transistor 124, and has its output connected to the gate electrode of previously-described disable transistor 112. The output of transistor 126 is also connected to a resistor 136, which has its other end coupled to the power supply line by a diode 138. The circuit configuration is completed by a "bootstrap" capacitor 140 which is connected between node A, at the output of transistor 124, and node B, at the junction between resistor 136 and diode 138. Finally, a loss of ground condition is represented symbolically by a dashed "X" at point C in the ground line.

While it will be understood that operation of circuit 114 is not dependent upon precise component values, some representative values are 15 kΩ for resistor 128, 45 kΩ for resistor 132, 30 kΩ for resistor 136 and 3 pf for capacitor 140. Additionally, while MOS transistors of particular polarity types are shown, it will be understood that the polarity type of all transistors may be reversed, and that bipolar transistors may be substituted for the MOS transistors shown in the figures. Additionally, in this example, Vcc may typically be about 12 volts, and the resistance of load 102 in FIG. 1 may typically be in the range of several ohms, resulting in a load current in the range of 1-10 amperes.

During normal circuit operation, MOS power transistor 100 is controlled at its gate electrode 106 by gate electrode control circuitry 108. In the "on" state, this gate voltage will be several volts above the power-supply voltage Vcc, as previously discussed, in order to ensure that the output voltage at the source of transistor 100 is as close as possible to the power supply voltage. Typically, the voltage at the source of transistor 100, which is the output voltage to the load, will be only about 0.5 volt less than the full power supply voltage. As will be discussed hereinafter, this high voltage at terminal 104, to which the source of disable transistor 112 is also connected, requires special measures to ensure that transistor 112 can be reliably activated to perform its disable function.

During normal operation, the circuit 114 receives a "low" signal at disable input 122, thus turning transistor 120 "on" and generating a voltage across resistor 128. This in turn will cause transistors 124 and 126 to be "on" in the normal operating state, and will drop the voltage at node A to a relatively low value. Thus, for example, if zener diode 134 has a 7-volt breakdown voltage, then node A will drop to a value of 7 volts below Vcc, or about 5 volts in the case of a 12 volt supply voltage. With transistor 126 also being turned "on", a node D at the output of transistor 126 and the input of transistor 112, will be close to ground, thus maintaining disable transistor 112 in the "off" state. Node B, however, will drop below Vcc by only one diode drop, or about 0.7 volts, when transistor 126 is turned "on", and thus will be slightly above 11 volts in the steady-state in this example. Accordingly, the voltage across capacitor 140 in the steady-state, which is the voltage at node B less the voltage at node A, will be about 6 volts in this example, since node B is at about 11 volts and node A is at about 5 volts.

Upon the occurrence of a "disable" condition, such as a loss of bias in the gate control circuitry 108, or the circuit being placed in "standby" mode, the voltage on disable input 122 of circuit 114 will go "high", thus turning transistors 120, 124 and 126 "off". When transistors 124 and 126 are turned "off", node A will rise to substantially the power-supply voltage Vcc, and node B, which was approximately 6 volts above node A in the steady-state, will momentarily rise above the power supply voltage Vcc. Once node B rises above Vcc, diode 138 will become reverse-biased, thus no longer clamping node B to the power-supply voltage. The voltage rise at node B is coupled to node D in substantially unattenuated form, since transistor 126 is "off" and the input impedance of transistor 112 is several orders of magnitude higher than the value of resistor 136.

Similarly, if a ground connection is lost in the gate control circuit 108 or the gate disable circuit 114, as shown symbolically in FIG. 2 at point C, transistors 120, 124 and 126 will be unable to conduct and will turn "off", and the circuit operation will be the same as previously described when the disable input 122 goes "high".

Thus, it should be noted that the present circuit offers several important advantages over prior-art circuits such as the one shown in European Patent No. 0239862. First, disable transistor 112 need not be a depletion-mode transistor, thus permitting simpler and more economical manufacture. Second, because the gate of disable transistor 112 is not permanently grounded, the present circuit may be used to provide a disable function upon a number of different occurrences, as discussed above, thus providing increased versatility. Finally, by the use of a bootstrap capacitor circuit, the present invention ensures reliable activation of the disable transistor 112 even when the gate voltage of transistor 100 is driven above Vcc and its source voltage is very close to Vcc.

An additional advantage of the present circuit is that the transient voltage rise above Vcc at the gate of transistor 112 need only occur for a very short interval in order to ensure that transistor 112 will be activated and transistor 100 disabled. Thus, once transistor 112 is activated by the transient high-voltage level at node B, coupled through resistor 136 to node D, then transistor 100 will begin to turn "off", and the voltage at the source electrode 104 of the transistor 100, which is connected to the source of transistor 112, will begin to drop, and the steady-state "high" voltage at node D (the power supply voltage Vcc less one diode drop) will be sufficient to maintain transistor 112 in the "on" state and transistor 100 in the "off" state. This mode of operation permits the use of a relatively small value for bootstrap capacitor 140, as noted above.

Finally, if the disable condition is removed, such as by restoration of the ground connection or bias voltage, the circuit will return to its steady-state operating condition, with disable input 122 "low", transistors 120, 124 and 126 "on", and disable transistor 112 "off".

While the invention has been particularly shown and described with reference to a preferred embodiment thereof, it will be understood by those skilled in the art that various changes in form and detail may be made without departing from the spirit and scope of the invention.

What is claimed is:

1. A control electrode disable circuit for a power transistor having a first main electrode coupled to a first power supply line, a second main electrode coupled to a first terminal of a load which has a second terminal coupled to a second power supply line, and a control electrode, said disable circuit comprising:
    a disable transistor having a first main electrode coupled to said control electrode of the power transistor, a second main electrode coupled to said first terminal of the load, and a control electrode; and
    circuit means coupled to said second power supply line and responsive to at least one of a disable signal and an open circuit between said second power supply line and said disable circuit for turning on said disable transistor, said circuit means comprising a capacitor having a first terminal means coupled to the control electrode of said disable transistor for generating a voltage at the control electrode of said disable transistor which is at least temporarily higher than a voltage on said first power supply line.

2. A control electrode circuit as in claim 1, wherein said capacitor is connected in said circuit means as a bootstrap capacitor.

3. A control electrode disable circuit as in claim 2, further comprising first and second control transistors, a main electrode means of said first control transistor being coupled to a second terminal of said bootstrap capacitor for controlling a voltage on said second terminal of the capacitor, a main electrode of said second control transistor being coupled to the control electrode of said disable transistor, and said first terminal means of the bootstrap capacitor being coupled to said first power supply line, said control electrode of the disable transistor, and said main electrode of the second control transistor.

4. A control electrode disable circuit as in claim 3, wherein said first terminal means of the bootstrap capacitor is coupled to said first power supply line by a diode connected with a polarity such that a voltage on said first terminal means of the bootstrap capacitor can rise above said voltage on the first power supply line, and said first terminal means of the bootstrap capacitor is coupled to said main electrode of the first control transistor by a resistor.

* * * * *